US012801026B2

(12) United States Patent
Szwedowicz et al.

(10) Patent No.: US 12,801,026 B2
(45) Date of Patent: Nov. 17, 2026

(54) EUV RADIATION BEAM POWER REDUCTION

(71) Applicant: ASML Netherlands B.V., Veldhoven (NL)

(72) Inventors: Konrad Szwedowicz, Eindhoven (NL); Ronny Der Kinderen, Rosmalen (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 18/876,781

(22) PCT Filed: Aug. 10, 2023

(86) PCT No.: PCT/EP2023/072122

§ 371 (c)(1),
(2) Date: Dec. 19, 2024

(87) PCT Pub. No.: WO2024/052041

PCT Pub. Date: Mar. 14, 2024

(65) Prior Publication Data

US 2025/0377601 A1 Dec. 11, 2025

(30) Foreign Application Priority Data

Sep. 9, 2022 (EP) .................................... 22194917

(51) Int. Cl.
*G03F 7/20* (2006.01)
*G02B 26/08* (2006.01)
(Continued)

(52) U.S. Cl.
CPC ......... *G03F 7/702* (2013.01); *G02B 26/0816* (2013.01); *G02B 26/10* (2013.01);
(Continued)

(58) Field of Classification Search
CPC .. G03F 7/702; G03F 7/70033; G03F 7/70141; G03F 7/70233; G03F 7/70508;
(Continued)

(56) References Cited

U.S. PATENT DOCUMENTS

| | | | |
|---|---|---|---|
| 2005/0206869 | A1 | 9/2005 | Voorma et al. |
| 2009/0091731 | A1 | 4/2009 | Ossmann et al. |

(Continued)

FOREIGN PATENT DOCUMENTS

| | | | |
|---|---|---|---|
| DE | 102019206867 | A1 | 7/2019 |
| EP | 1 026 547 | A2 | 8/2000 |
| WO | WO 2020/239430 | A1 | 12/2020 |

OTHER PUBLICATIONS

International Search Report and Written Opinion of the International Searching Authority directed to International Patent Application No. PCT/EP2023/072122, mailed Nov. 21, 2023; 10 pages.

*Primary Examiner* — Mesfin T Asfaw
(74) *Attorney, Agent, or Firm* — Finnegan, Henderson, Farabow, Garrett & Dunner LLP

(57) ABSTRACT

A method of providing an additional EUV radiation exposure of part of a die on a substrate at a level of EUV radiation power which compensates for a previous low exposure, the method using EUV radiation power incident upon a patterning device of a lithographic apparatus, the lithographic apparatus comprising a first array of mirrors and a second array of mirrors, the first array of mirrors being configured to receive EUV radiation and to reflect the EUV radiation as sub-beams of radiation towards the second array of mirrors, wherein the method comprises rotating mirrors of the first array such that at least some of the sub-beams of radiation are incident on mirrors of the second array at positions which provide reduced transmission of the sub-beams of radiation to the patterning device.

15 Claims, 3 Drawing Sheets

(51) Int. Cl.
*G02B 26/10* (2006.01)
*G03F 7/00* (2006.01)

(52) U.S. Cl.
CPC ...... *G03F 7/70033* (2013.01); *G03F 7/70141* (2013.01); *G03F 7/70233* (2013.01); *G03F 7/70508* (2013.01); *G03F 7/70516* (2013.01); *G03F 7/70525* (2013.01); *G03F 7/7055* (2013.01)

(58) Field of Classification Search
CPC ............. G03F 7/70516; G03F 7/70525; G03F 7/7055; G03F 7/70091; G03F 7/70466; G03F 7/70116; G02B 26/0816; G02B 26/10
See application file for complete search history.

(56) References Cited

U.S. PATENT DOCUMENTS

| | | | | |
|---|---|---|---|---|
| 2010/0009294 | A1* | 1/2010 | Shih | G03F 7/70425 430/312 |
| 2013/0078557 | A1 | 3/2013 | Hotzel | |
| 2013/0208253 | A1 | 8/2013 | Shim | |
| 2017/0336719 | A1 | 11/2017 | Winkler et al. | |
| 2021/0263421 | A1 | 8/2021 | Gang et al. | |

* cited by examiner

EUV RADIATION BEAM POWER REDUCTION

CROSS-REFERENCE TO RELATED APPLICATIONS

This application claims priority of EP Application Serial No. 22194917.5 which was filed on Sep. 9, 2022 and which is incorporated herein in its entirety by reference.

FIELD

The present invention relates to reducing the power of an EUV radiation beam which is incident upon a patterning device in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-22 nm, for example 6.7 nm or 13.5 nm, may be used to form smaller features on a substrate than a lithographic apparatus which uses, for example, radiation with a wavelength of 193 nm.

The lithographic apparatus may be provided with EUV radiation from a radiation source of a type which is referred to as a laser produced plasma (LPP) source. In an LPP source, a laser system such as a $CO_2$ laser with optical amplifiers, generated laser pulses which deposit energy into a fuel such as tin (Sn) which is provided from a fuel emitter. The fuel may be provided as a droplet. The deposition of laser energy into the tin creates a tin plasma. EUV radiation is emitted from the plasma during de-excitation and recombination of electrons with ions of the plasma.

An LPP EUV radiation source is a highly complex system and it may be difficult to control the power of EUV radiation which is emitted by the source. For example, if it is desired to temporarily reduce the power of light emitted from the source, for instance, for die repair, then the power provided to the laser and/or optical amplifiers cannot merely be turned down slightly and then returned to its original position in order to achieve this. Modifying the power provided to the laser and/or amplifiers in this manner would be liable to generate undesired and substantial fluctuations of the power of light delivered to the tin droplets.

Although other sources of EUV radiation are known, these sources either do not provide sufficiently high power for practical use in an EUV lithographic apparatus, or are impractical in other ways (e.g. due to size or cost).

In general, it may be difficult to control the power of EUV radiation output from known EUV radiation sources which are suitable for use in a lithographic apparatus.

It may be desirable to provide a method and apparatus that overcomes or mitigates one or more problems associated with the prior art.

SUMMARY

According to a first aspect of the present invention, there is provided a method of providing an additional EUV radiation exposure of part of a die on a substrate at a level of EUV radiation power which compensates for a previous low exposure, the method using EUV radiation power incident upon a patterning device of a lithographic apparatus, the lithographic apparatus comprising a first array of mirrors and a second array of mirrors, the first array of mirrors being configured to receive EUV radiation and to reflect the EUV radiation as sub-beams of radiation towards the second array of mirrors, wherein the method comprises rotating mirrors of the first array such that at least some of the sub-beams of radiation are incident on mirrors of the second array at positions which provide reduced transmission of the sub-beams of radiation to the patterning device.

Advantageously, the method reduces the power incident upon the patterning device without modifying the power output from an EUV radiation source (it may be difficult to control the power output from an EUV radiation source).

The sub-beams of radiation may be moved from starting positions on the mirrors of the second array which provide maximum transmission of the sub-beams of radiation.

The sub-beams of radiation may be moved from starting positions on the mirrors of the second array which are at centers of the mirrors of the second array.

The reduced transmission may be provided without parts of the sub-beams of radiation falling outside of the mirrors of the second array.

The reduced transmission may be provided with parts of the sub-beams of radiation falling outside of the mirrors of the second array.

Some sub-beams of radiation may be moved in a first direction across the mirrors of the second array and other sub-beams of radiation may be moved in a second direction across the mirrors of the second array.

The second direction may be opposite to the first direction.

The rotations of the mirrors of the first array may be performed based upon a predetermined transmission calibration.

All of the mirrors of the first array may be rotated.

The power of the EUV radiation beam may be reduced without modifying the telecentricity of the EUV radiation beam.

The transmission of the EUV radiation beam may for example be reduced by 50% or more.

According to a second aspect of the present invention, there is provided a lithographic apparatus comprising an illumination system which comprises a first array of mirrors and a second array of mirrors, the first array of mirrors being configured to receive EUV radiation and to reflect the EUV radiation as sub-beams of radiation towards the second array of mirrors, wherein the lithographic apparatus further method comprises a controller configured to rotate mirrors of the first array such that at least some of the sub-beams of radiation are incident on mirrors of the second array at positions which provide reduced transmission by the illumination system of the sub-beams of radiation, the reduced transmission compensating for a previous low exposure of part of a die, and then performing an exposure of that part of the die.

Advantageously, the lithographic apparatus reduces the power transmitted by the illumination system without modifying the power output from an EUV radiation source (it may be difficult to control the power output from an EUV radiation source).

The controller may be configured to rotate mirrors of the first array such that the sub-beams of radiation move from starting positions on the mirrors of the second array which provide maximum transmission of the sub-beams of radiation.

The controller may be configured to rotate mirrors of the first array such that the reduced transmission is provided with parts of the sub-beams of radiation falling outside of the mirrors of the second array.

The controller may be configured to rotate mirrors of the first array such that some sub-beams of radiation are moved in a first direction across the mirrors of the second array and other sub-beams of radiation are moved in second direction across the mirrors of the second array.

The second direction may be opposite to the first direction.

The controller may be configured to rotate all of the mirrors of the first array.

The lithographic apparatus may further comprise a memory which stores predetermined transmission calibration data as a function of rotation of the mirrors of the first array.

According to a third aspect of the invention there is provided a lithographic illumination system which comprises a first array of mirrors and a second array of mirrors, the first array of mirrors being configured to receive EUV radiation and to reflect the EUV radiation as sub-beams of radiation towards the second array of mirrors, wherein the illumination system further method comprises a controller configured to rotate mirrors of the first array such that at least some of the sub-beams of radiation are incident on mirrors of the second array at positions which provide reduced transmission by the illumination system of the sub-beams of radiation.

The controller may be configured to rotate mirrors of the first array such that the reduced transmission is provided with parts of the sub-beams of radiation falling outside of the mirrors of the second array.

According to a fourth aspect of the invention there is provided computer-readable storage medium comprising instructions which, when executed by a processor of a computing device cause the computing device to perform the method of the first aspect of the invention.

According to a fifth aspect of the invention, there is provided a computing device comprising a processor and memory, the memory storing instructions which, when executed by the processor cause the computing device to perform the method of the first aspect of the invention.

Features of different aspects of the invention may be combined together.

BRIEF DESCRIPTION OF THE DRAWINGS

Embodiments of the invention will now be described, by way of example only, with reference to the accompanying schematic drawings, in which.

DETAILED DESCRIPTION

Figure 1:
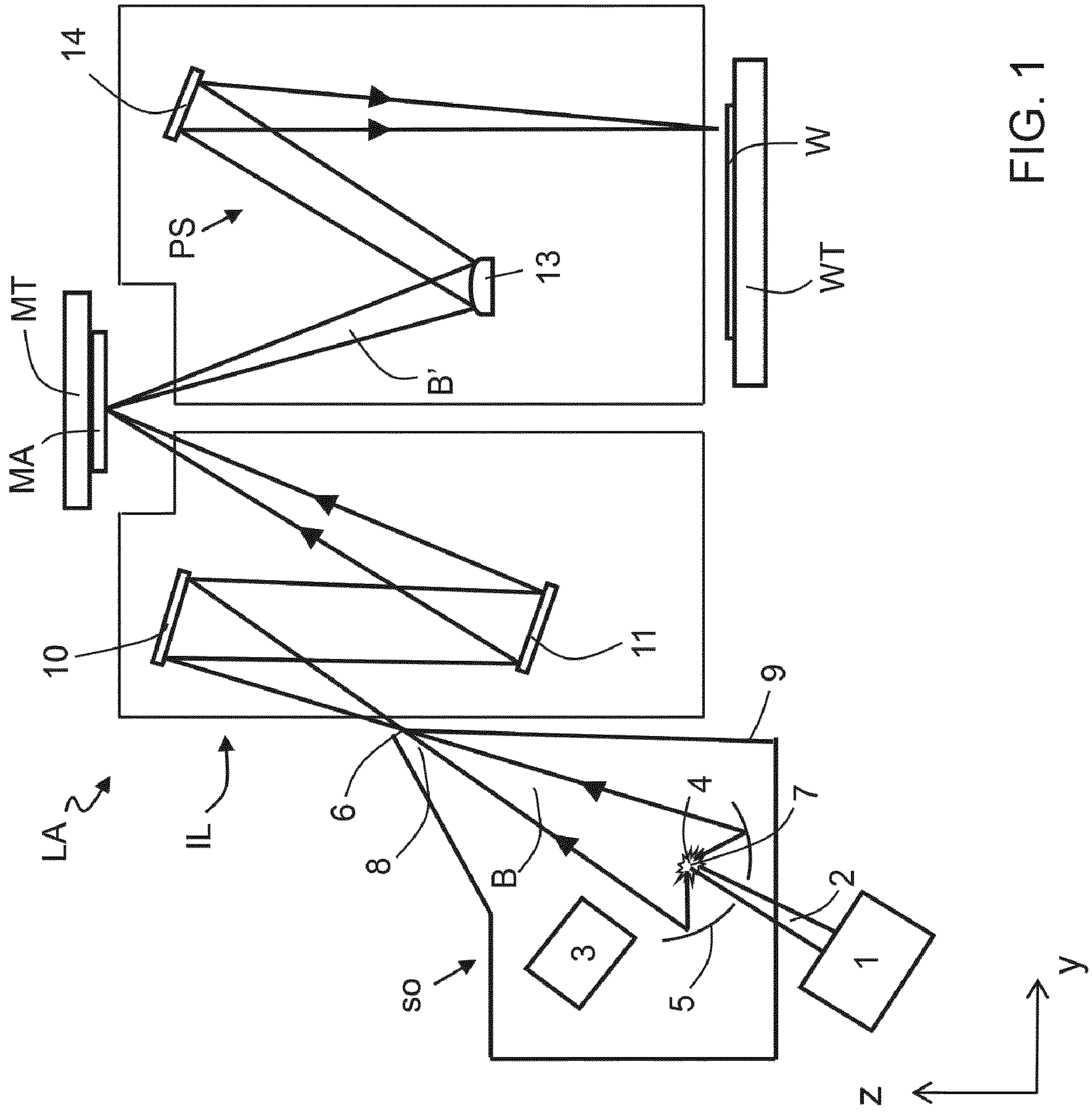
FIG. 1 schematically depicts a lithographic system comprising a radiation source and a lithographic apparatus according to an embodiment of the invention.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors in addition to the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

During a scanning exposure, the patterning device MA and support structure MT move in the y-direction, and the substrate W and substrate table WT move in the opposite y-direction. In this way, a band of EUV radiation passes over an exposure field on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Figure 2:
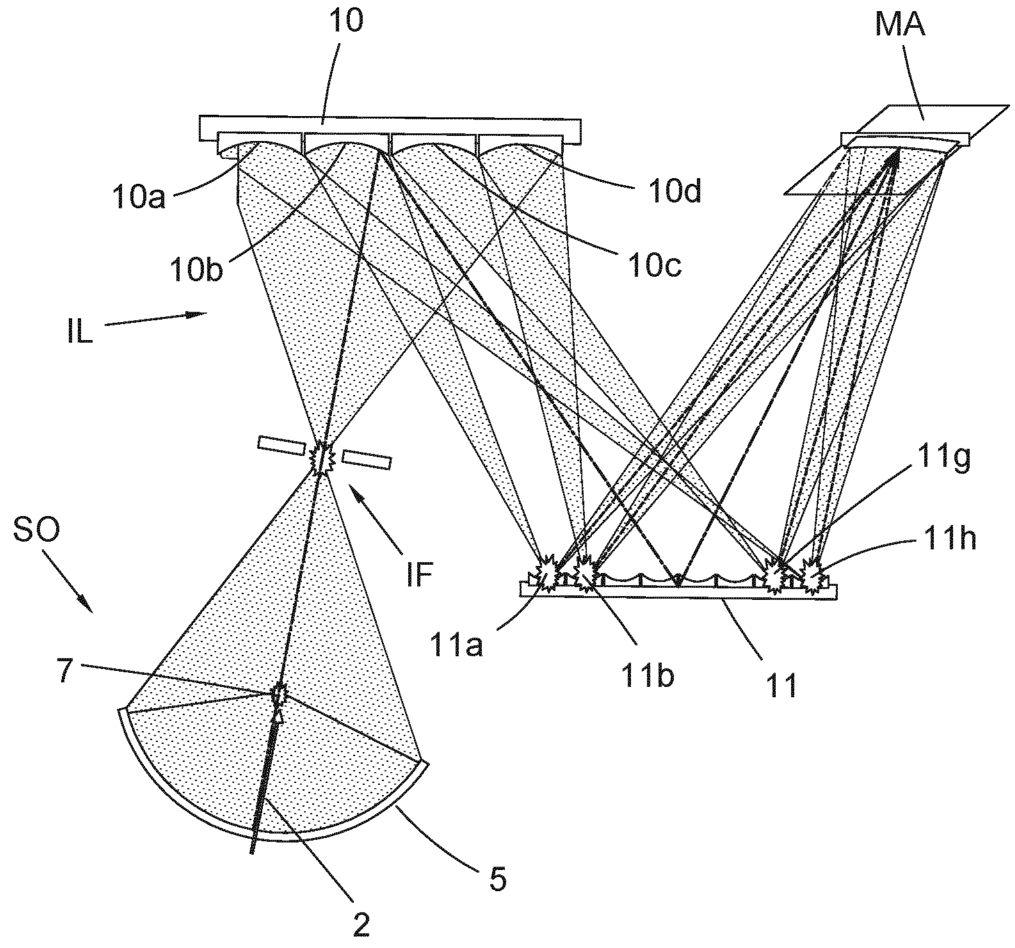
FIG. 2 schematically depicts the radiation source and schematically depicts an illumination system and patterning device of the lithographic apparatus.

FIG. 2 schematically depicts the radiation source SO, depicts the illumination system IL in more detail, and depicts the patterning device MA. As described further above, a laser beam 2 is incident upon a tin droplet thereby forming an EUV emitting plasma 7. The EUV radiation is collected by the collector 5, is focused through the intermediate focus IF and is incident upon the faceted field mirror device 10.

The faceted field mirror device 10 comprises an array of individually moveable mirrors. The faceted field mirror device 10 may be referred to as a first array of mirrors or a first mirror array. The faceted field mirror device 10 is schematically depicted as comprising four mirrors 10*a-d*. In practice, the faceted field mirror device 10 will comprise more mirrors. The mirrors may be arranged as a two-dimensional array. The mirrors may each be concave (as schematically depicted). In one example, the faceted field mirror device 10 may comprise at least 100 mirrors, may comprise at least 300 mirrors, and may comprise at least 500 mirrors. In one example, the faceted field mirror device may comprise up to 300 mirrors, up to 500 mirrors, or a much larger number of mirrors, e.g. up to 10,000 mirrors, up to 100,000 mirrors, up to 500,000 mirrors or more. The mirrors, which may be referred to as facets, may be individually moveable.

The faceted pupil mirror device 11 is also depicted in more detail in FIG. 2. The faceted pupil mirror device 11 comprises an array of mirrors 11*a-h* which may be individually moveable. Only some of the mirrors are labelled in FIG. 2 in order to avoid complicating FIG. 2. The faceted pupil mirror device 11 may be referred to as a second array of mirrors or a second mirror array. The mirrors 11 may be referred to as facets. As schematically depicted, the mirrors may be concave.

In FIG. 2 the faceted pupil mirror device 11 has two times as many mirrors 11*a-h* as the faceted field mirror device 10. In general, it may be desirable for the faceted pupil mirror device 11 to have more mirrors than the faceted field mirror device 10. This is because the additional mirrors faceted of the pupil mirror device 11 allow greater flexibility in the generation of an illumination pupil (as is described below). The faceted pupil mirror device may have twice as many mirrors as the faceted field mirror device, three times as many mirrors, or some other multiple.

Because the mirrors of the faceted field mirror device 10 and the mirrors of the faceted pupil mirror device 11 are concave, the mirrors act as lenses. As a result, the faceted field mirror device 10 and faceted pupil mirror device 11 act as an optical system. Working backwards from the patterning device MA, the patterning device MA may be considered to be a field plane, the faceted pupil mirror device 11 may be considered to be a pupil plane, and the faceted field mirror device 10 may be considered to be a field plane of the optical system. Consequently, the patterning device MA sees images of the field facet mirrors of the faceted field mirror device 10. The illumination pupil of the radiation received by the patterning device MA is determined by the distribution of radiation which is incident upon the mirrors 11*a-h* of the faceted pupil mirror device 11.

The mirrors of the faceted field mirror device 10 may each be shaped as an elongate curve with a constant width. An image of this elongate curve is formed at the patterning device MA and as a result the patterning device is illuminated by radiation shaped as a elongate curve. As is schematically depicted, mirrors 11*a-h* of the faceted pupil mirror device 11 may be oriented such that individual images of the mirrors 10*a-d* of the faceted field mirror device 10 overlie each other at the patterning device MA.

Mirrors of the faceted pupil mirror device 11 receive an image of the radiation at the intermediate focus IF. Because the faceted pupil mirror device 11 has more mirrors than the faceted filed mirror device 10, only some of the mirrors 11*a,b,g,h* of the faceted pupil mirror device receive radiation at any given time (as is schematically depicted).

In general, each mirror of the faceted field mirror device 10 provides what may be referred to as a sub-beam of radiation. Each sub-beam of radiation may be incident upon a different mirror of the faceted pupil mirror device 11.

The orientation of each mirror of the faceted field mirror device 10 is individually adjustable. This allows the EUV radiation to be directed to desired positions at the faceted pupil mirror device 11 and thereby form a desired illumination pupil. For example, a dipole mode (or dipole-like mode) may be formed by directing the radiation to two areas either side of the center of the faceted pupil mirror device 11. This is schematically depicted in FIG. 2, although in practice more pupil facet mirrors would be illuminated when forming a dipole illumination mode (see FIG. 5 and associated description further below).

Figure 3:
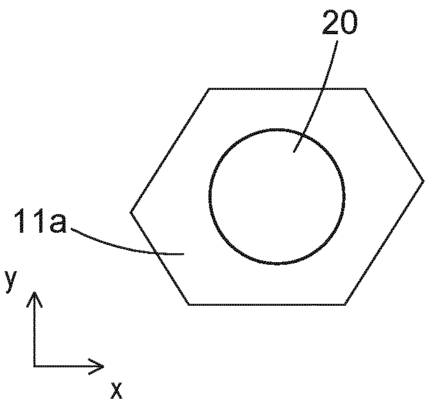
FIG. 3 schematically depicts a mirror which forms part of a second array of mirrors of the illumination system.

FIG. 3 depicts one mirror 11*a* of the faceted pupil mirror device 11. As may be seen, the mirror 11*a* is generally hexagonal (although the mirror may not be a perfect hexagon, and in other embodiments may have a different shape). FIG. 3 also schematically depicts EUV radiation which is incident upon the mirror 11*a*. As noted above, the mirror 11*a* sees an image of the intermediate focus IF, and thus sees an image of the EUV radiation emitting plasma 7. For simplicity the EUV radiation (which may be referred to as a sub-beam) is schematically depicted as a disk in FIG. 3. As depicted, the illumination system IL may be configured such that during exposure of a lithographic substrate W a mirror 10*b* of the faceted field mirror device 10 directs an EUV radiation sub-beam 20 at the center of a mirror 11*a* of the faceted pupil mirror device 11. During conventional operation of the lithographic apparatus this advantageously maximizes performance of the lithographic apparatus. That is, substantially all of the EUV radiation sub-beam 20 directed by the mirror 10*b* of the faceted field mirror device 10 is reflected by the mirror 11*a* of the faceted pupil mirror device 11 towards the patterning device MA. In general, it is usually desirable to maximize the power of EUV radiation incident upon a lithographic substrate W during operation of the lithographic apparatus LA, since this allows lithographic exposure to proceed more quickly thereby maximizing throughput of the lithographic apparatus.

In some circumstances it is desirable to be able to provide the EUV radiation beam B to the patterning device at a significantly reduced power. One example is when it has been determined that part of a die which has been exposed by the lithographic apparatus did not receive a sufficiently high dose of EUV radiation. This part of the die may be provided with an additional exposure of EUV radiation at a level of power which compensates for the previously low exposure. The amount of EUV power which is desirable for this compensation exposure may be significantly less than a conventional exposure power. It may be difficult to control the EUV radiation source SO in order to provide such low power because substantial adjustments to the power of the EUV radiation source may cause significant undesirable fluctuations of output power.

In an embodiment of the invention, the power of EUV radiation delivered to the patterning device MA is reduced by moving at least some of the radiation sub-beams such that they are no longer incident at centers of mirrors 11*a-g* of the faceted pupil mirror device 11. The radiation sub-beams may partially overlap the mirrors 11*a-g* of the faceted pupil mirror device 11. The radiation sub-beams are moved to be incident on mirrors of the faceted pupil mirror device 11 at positions which provide reduced transmission of the sub-beams of radiation to the patterning device MA. The transmission may for example be reduced by 50% or more.

Figure 4:
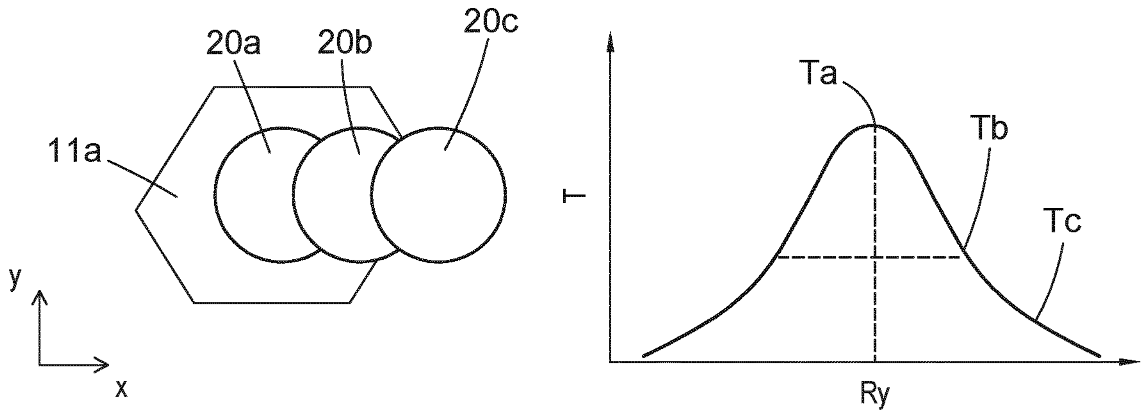
FIG. 4 schematically depicts a sub-beam of radiation incident centrally on the mirror and partially overlapping with the mirror, and also depicts a graph showing transmission of the mirror.

FIG. 4 schematically depicts on a left hand side the mirror 11*a* of the faceted pupil mirror device 11 together with a sub-beam of EUV radiation at three different positions 20*a-c*. A right hand side of FIG. 4 is a graph which schematically depicts the transmission T of the mirror 11*a* as a function of the rotational position Ry of the mirror 10*b* of the faceted field mirror device 10 which directs the radiation beam onto the mirror 11*a* of the faceted pupil mirror device 11. Although the rotation of the mirror 10*b* of the faceted field mirror device 10 in this case is around the Y-axis, thereby moving the radiation sub-beam in the X-direction, the rotation may alternatively be around the Y-axis. Rotation around both axis may also be used. Rotation of the mirror 10*b* of the faceted field mirror device 10 causes translation of the radiation sub-beam 20 across the surface of the mirror 11*a* of the faceted pupil mirror device 11. Rotation of a mirror may also be referred to as tilting of a mirror.

When the radiation sub-beam 20*a* is centrally positioned on the mirror 11*a* of the faceted pupil mirror device 11, the transmission of the mirror is at a maximum. In this context, transmission may be considered to refer the proportion of radiation which is incident at the patterning device MA. The maximum transmission is schematically shown as a peak Ta of the transmission curve depicted in the graph of FIG. 4.

When the radiation sub-beam 20*b* is moved such that part of the radiation sub-beam is no longer incident upon the mirror 11*a*, but instead falls outside of the mirror, the transmission of the mirror is reduced significantly. This is schematically indicated by reduced transmission Tb on the transmission curve of FIG. 4.

When the radiation sub-beam 20*c* moves further away from the center of the mirror 11*a* such that most of the radiation sub-beam is not incident upon the mirror, the transmission of the mirror 11*a* is further reduced. This is schematically indicated by the transmission Tc in the transmission graph of FIG. 4.

As is schematically indicated by the graph in FIG. 4, the transmission of the mirror 11*a* follows a curve. Consequently, the curve allows the transmission of the mirror 11*a* to be reduced in a controlled manner via the orientation of the mirror 10*b* of the faceted field mirror device 10.

In general, movement of the radiation sub-beam 20 away from a position which provides maximum transmission may reduce the transmission of the mirror 11*a*. This may apply even if all of the radiation sub-beam is still incident upon the mirror, i.e. even if there is not a partial overlap of the radiation sub-beam with the mirror.

FIG. 4 depicts movement of one radiation sub-beam with respect to one mirror 11*a* of the faceted pupil mirror device 11. In practice, as explained further above, a plurality of radiation sub-beams are provided, the radiation sub-beams generally being directed to different mirrors of the faceted pupil mirror device 11. In practice therefore, when it is desired to reduce the transmission of the illumination system IL, in order to provide reduced power of EUV radiation at the patterning device MA, a plurality of mirrors of the faceted field mirror device 10 may be rotated such that they move radiation sub-beams to positions on mirrors of the faceted pupil mirror device 11 which provide reduced transmission.

In an embodiment, a subset of radiation sub-beams may be moved to partially overlap with mirrors of the faceted pupil mirror device 11 (or to positions which provide reduced transmission). The remaining radiation sub-beams may remain at positions on mirrors of the faceted pupil mirror device 11 which provide maximum transmission (e.g. at centers of the mirrors). The transmission curve of each mirror of the faceted pupil mirror device 11 as a function of orientation of a mirror of the faceted field mirror device 10 may be known and may be stored by in a memory the lithographic apparatus. These known transmission curves allow for the transmission of each mirror of the faceted pupil mirror device 11 to be controlled in a known manner.

Moving only a subset of the radiation sub-beams to partially overlap with the pupil facet mirrors provides a further mechanism for controlling the transmission provided by the illumination system IL. For example, if 10% of the mirrors of the faceted pupil mirror device 11 are moved then this will provide a smaller reduction of transmission than if 20% of the mirrors of the of the faceted pupil mirror device are moved.

Figure 5:
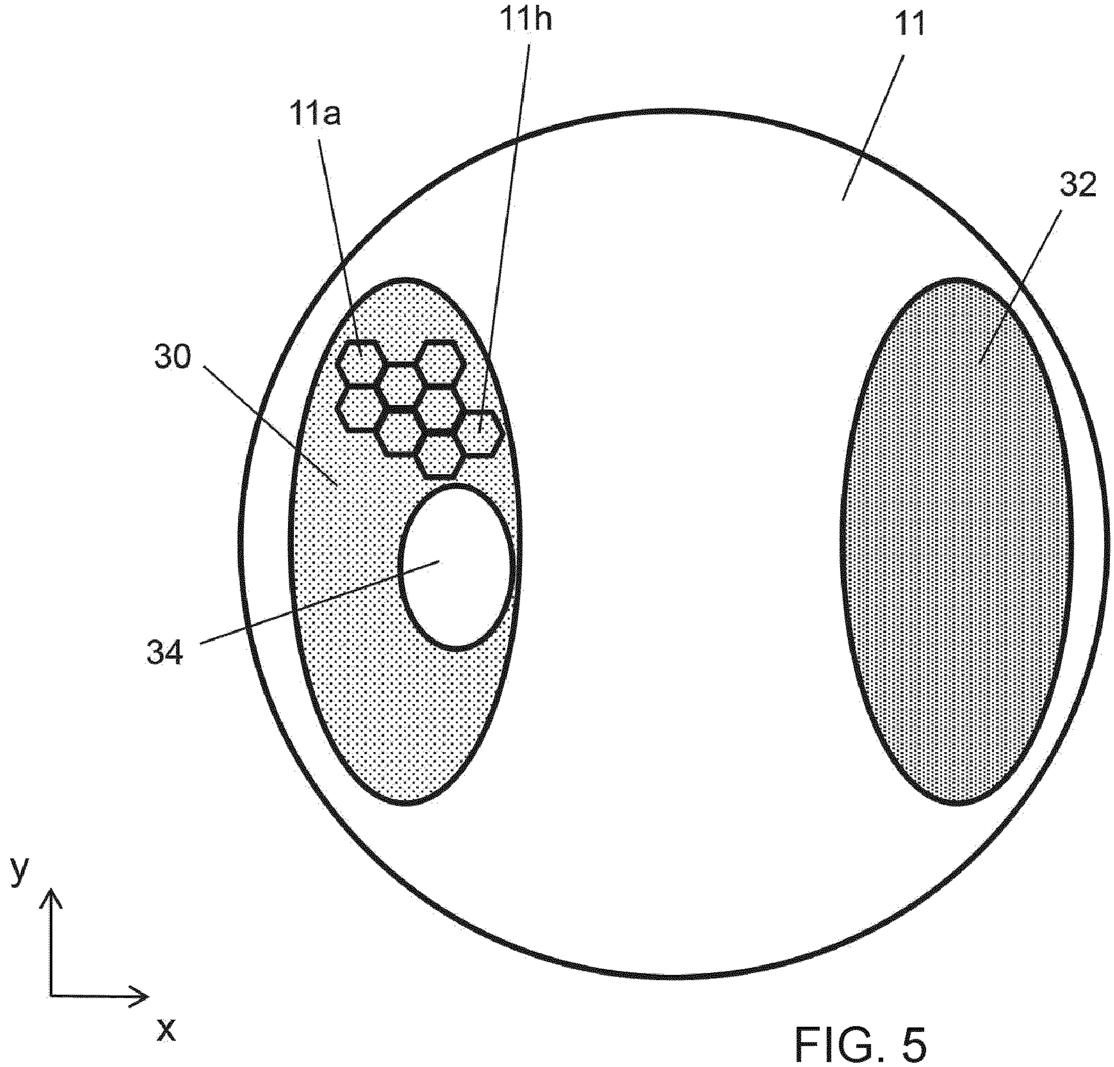
FIG. 5 schematically depicts the second array of mirrors of the illumination system and schematically depicts an illumination mode.

Moving a subset of radiation sub-beams to partially overlap with mirrors of the faceted pupil mirror device 11 allows EUV radiation beam transmission to be reduced without modifying the telecentricity of the radiation beam. This is illustrated schematically in FIG. 5. FIG. 5 schematically depicts the faceted pupil mirror device 11 viewed from above. For illustrative purposes, a small proportion of the mirrors of the faceted pupil mirror device 11 are also depicted. In FIG. 5 the mirrors of the faceted field mirror device 10 (not shown) have been oriented such that they direct EUV radiation to form a dipole mode at the pupil plane of the illumination system IL (i.e. at the faceted pupil mirror device 11). The dipole mode is schematically depicted as a left hand pole 30 and a right hand pole 32.

FIG. 5 schematically depicts the faceted pupil mirror device 11 viewed from above. For illustrative purposes a few of the mirrors 11*a*-*h* (only two of which are labelled) of the faceted pupil mirror device 11 are depicted. A dipole mode consisting of two areas 30, 32 of EUV radiation is formed at the faceted pupil mirror device 11. The dipole mode has been formed by using mirrors of the faceted field mirror device 10 to direct EUV radiation to the first and second areas 30, 32.

When it is desired to reduce the power of EUV radiation incident at the patterning device MA, a sub-set of the mirrors of the faceted field mirror device 10 may be rotated such that the EUV radiation sub-beams are moved away from centers of the mirrors of the faceted pupil mirror device 11. As explained above, this reduces the power of EUV radiation which is reflected from the mirrors of the faceted pupil mirror device 11, thereby reducing the power of EUV radiation incident at the patterning device MA. In FIG. 5 an area 34 which forms part of the left hand area of 30 of the dipole mode is depicted. If all of the EUV radiation sub-beams which were moved to reduce transmission were to be located in this area 34, then this would have an undesirable effect in that it would significantly modify the illumination mode. The shape of the illumination mode would change and the telecentricity of the illumination mode would be changed. In order to reduce undesirable modifications of the illumination mode, when the EUV radiation sub-beams are moved to reduce EUV power, the locations of the mirrors of the faceted pupil mirror device 11 at which the radiation sub-beams are moved may be distributed across illuminated portions of an illumination mode (i.e. portions of an illumination mode which are not dark).

In another embodiment, instead of tilting a sub-set of the mirrors of the faceted field mirror device 10, all of the mirrors may be tilted (that is, all of the mirrors may be caused to rotate). As depicted in FIG. 4, each mirror of the faceted pupil mirror device 11 has a transmission curve which is known as a function of rotation of a mirror (or more than one mirror) of the faceted field mirror device 11. As schematically depicted in FIG. 4, an initial movement of the EUV radiation sub-beam away from a center (or other position which provides maximum transmission) of the mirror of the faceted pupil mirror device 11 will cause only a small reduction of transmission. In general, the reduction of EUV transmission which is provided by rotating all of the mirrors of the faceted field mirror device 10 is controllable in a straightforward manner. It follows that any desired reduction of transmission as needed for an exposure of a die may therefore be obtained. The reduction of transmission may for example be a reduction of 50% or more.

The reduction of transmission which is provided by rotation of the field facet mirrors may be stored as a look-up table or other suitable form of data (e.g. in a memory which may form part of the lithographic apparatus). The reduction of transmission may be measured via a calibration measurement which is performed for each mirror of the faceted field mirror device 10. The calibration may be performed for that mirror in respect of each of the mirrors of the faceted pupil mirror device 11 which may receive radiation reflected from that mirror in use. The calibrations may be combined together to form a data set. Thus, a predetermined calibration of the reduction of transmission as a function of mirror rotation may be used by embodiments of the invention.

A controller may control rotation of the mirrors of the faceted field mirror device 10. The controller may control the rotation based upon data which calibrates reduction of transmission as a function of mirror rotation.

When all of the of the mirrors of the faceted field mirror device 10 are rotated to reduce transmission, the direction of rotation may be randomized, or distributed in some other manner. This may be such that there is no significant change of the geometry of the illumination mode in the plane of the faceted pupil mirror device 11. If all of the mirrors of the faceted field mirror device 10 were to be rotated in the same direction, then this would have the effect of causing a sideways movement of the illumination mode at the faceted pupil mirror device 11. This would change the telecentricity of the EUV radiation beam incident at the patterning device and may be undesirable. The same may apply when a sub-set of the mirrors of the faceted field mirror device 10 are rotated to reduce transmission.

As noted above, the direction of rotation of the mirrors of the faceted field mirror device 10 when reducing transmission may be distributed, e.g. via randomization, in order to avoid a cumulative translation of the illumination mode in the plane of the faceted pupil mirror device 11. However, despite this, movement of the EUV radiation sub-beams away from centers (or other maximum transmission positions) of mirrors of the faceted pupil mirror device 11 may nevertheless have some effect upon the illumination mode. Computer modelling of this effect may be performed, using data obtained via the above mentioned calibration measurements. The modelling may be iterative or analytical, and may seek to minimize the effect of the EUV radiation sub-beam movements upon the illumination mode. The model may for example seek to minimize a change of telecentricity, seek to minimize non-uniformity of EUV radiation as incident upon the patterning device MA, etc.

In general, in embodiments of the invention a sub-beam of radiation is moved on a mirror of the faceted pupil mirror device 11 to a position which provides reduced transmission of the sub-beam of radiation to the patterning device. The sub-beam of radiation may be moved from a starting position which provides maximum transmission of the sub-beam of radiation. The starting position of the sub-beam of radiation may be at a center of the mirror of the faceted pupil mirror device 11. The reduced transmission may be provided without part of the sub-beam falling outside of the mirror of the faceted pupil mirror device 11. The reduced transmission may be provided with part of the sub-beam falling outside of the mirror of the faceted pupil mirror device 11.

A method according to an embodiment of the invention may be performed by a computing device. The device may comprise a central processing unit ("CPU") to which is connected a memory. The method described herein may be implemented in code (software) stored on a memory comprising one or more storage media, and arranged for execution on a processor comprising on or more processing units. The storage media may be integrated into and/or separate from the CPU. The code, which may be referred to as instructions, is configured to be fetched from the memory and executed on the processor to perform operations in line with embodiments discussed herein. Alternatively it is not excluded that some or all of the functionality of the CPU is implemented in dedicated hardware circuitry, or configurable hardware circuitry like an FPGA. In general, the method may be performed by a processor.

The computing device may comprise an input configured to enable a user to input data into a software program running on the CPU. The input device may comprise a mouse, keyboard, touchscreen, microphone etc. The computing device may further comprises an output device configured to output results of measurements to a user.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below.

1. A method of reducing EUV radiation power incident upon a patterning device of a lithographic apparatus, the lithographic apparatus comprising a first array of mirrors and a second array of mirrors, the first array of mirrors being configured to receive EUV radiation and to reflect the EUV radiation as sub-beams of radiation towards the second array of mirrors, wherein the method comprises rotating mirrors of the first array such that at least some of the sub-beams of radiation are incident on mirrors of the second array at positions which provide reduced transmission of the sub-beams of radiation to the patterning device.
2. The method of clause 1, wherein the sub-beams of radiation are moved from starting positions on the mirrors of the second array which provide maximum transmission of the sub-beams of radiation.
3. The method of clause 1 or clause 2, wherein the sub-beams of radiation are moved from starting positions on the mirrors of the second array which are at centers of the mirrors of the second array.
4. The method of any preceding clause, wherein the reduced transmission is provided without parts of the sub-beams of radiation falling outside of the mirrors of the second array.
5. The method of any of clauses 1 to 4, wherein the reduced transmission is provided with parts of the sub-beams of radiation falling outside of the mirrors of the second array.
6. The method of any preceding clause, wherein some sub-beams of radiation are moved in a first direction across the mirrors of the second array and other sub-beams of radiation are moved in a second direction across the mirrors of the second array, the second direction being opposite to the first direction.
7. The method of any preceding clause, wherein the rotations of the mirrors of the first array are performed based upon a predetermined transmission calibration.
8. The method of any preceding clause, wherein all of the mirrors of the first array are rotated.
9. A lithographic apparatus comprising an illumination system which comprises a first array of mirrors and a second array of mirrors, the first array of mirrors being configured to receive EUV radiation and to reflect the EUV radiation as sub-beams of radiation towards the second array of mirrors, wherein the lithographic apparatus further method comprises a controller configured to rotate mirrors of the first array such that at least some of the sub-beams of radiation are incident on mirrors of the second array at positions which provide reduced transmission by the illumination system of the sub-beams of radiation.
10. The lithographic apparatus of clause 9, wherein the controller is configured to rotate mirrors of the first array such that the sub-beams of radiation move from starting positions on the mirrors of the second array which provide maximum transmission of the sub-beams of radiation.
11. The lithographic apparatus of clause 9 or clause 10, wherein the controller is configured to rotate mirrors of the first array such that the reduced transmission is provided with parts of the sub-beams of radiation falling outside of the mirrors of the second array.
12. The lithographic apparatus of any of clauses 9 to 11, wherein the controller is configured to rotate mirrors of the first array such that some sub-beams of radiation are moved in a first direction across the mirrors of the second array and other sub-beams of radiation are moved in second direction across the mirrors of the second array, the second direction being opposite to the first direction.
13. The lithographic apparatus of any of clauses 9 to 12, wherein the controller is configured to rotate all of the mirrors of the first array.
14. The lithographic apparatus of any of clauses 9 to 13, wherein the lithographic apparatus further comprises a memory which stores predetermined transmission calibration data as a function of rotation of the mirrors of the first array.

15. A lithographic illumination system which comprises a first array of mirrors and a second array of mirrors, the first array of mirrors being configured to receive EUV radiation and to reflect the EUV radiation as sub-beams of radiation towards the second array of mirrors, wherein the illumination system further method comprises a controller configured to rotate mirrors of the first array such that at least some of the sub-beams of radiation are incident on mirrors of the second array at positions which provide reduced transmission by the illumination system of the sub-beams of radiation.

The invention claimed is:

1. A method for directing EUV radiation onto a patterning device of a lithographic apparatus, wherein the lithographic apparatus comprises a first array of mirrors and a second array of mirrors, the method comprising:

directing the EUV radiation at the first array of mirrors that is configured to receive the EUV radiation and to reflect the EUV radiation as sub-beams of radiation towards the second array of mirrors;

rotating mirrors of the first array such that at least some of the sub-beams of radiation are incident on mirrors of the second array at positions that provide reduced transmission of the sub-beams of radiation to the patterning device; and exposing part of a die on a substrate with the sub-beams of radiation at a level of EUV radiation power that compensates for a previous low exposure.

2. The method of claim 1, wherein the sub-beams of radiation are moved from starting positions on the mirrors of the second array that provide maximum transmission of the sub-beams of radiation.

3. The method of claim 1, wherein the sub-beams of radiation are moved from starting positions on the mirrors of the second array that are at centers of the mirrors of the second array.

4. The method of claim 1, wherein the reduced transmission is provided without parts of the sub-beams of radiation falling outside of the mirrors of the second array.

5. The method of claim 1, wherein the reduced transmission is provided with parts of the sub-beams of radiation falling outside of the mirrors of the second array.

6. The method of claim 1, wherein some sub-beams of radiation are moved in a first direction across the mirrors of the second array and other sub-beams of radiation are moved in a second direction across the mirrors of the second array, the second direction is opposite to the first direction.

7. The method of claim 1, wherein the rotating of the mirrors of the first array is performed based upon a predetermined transmission calibration.

8. The method of claim 1, wherein all of the mirrors of the first array are rotated.

9. The method of claim 1, wherein a power of the sub-beams of radiation is reduced without modifying a telecentricity of the sub-beams of radiation.

10. A lithographic apparatus comprising:

an illumination system that comprises a first array of mirrors and a second array of mirrors, the first array of mirrors is configured to receive EUV radiation and to reflect the EUV radiation as sub-beams of radiation towards the second array of mirrors; and a controller configured to rotate mirrors of the first array such that at least some of the sub-beams of radiation are incident on mirrors of the second array at positions that provide reduced transmission by the illumination system of the sub-beams of radiation, wherein the reduced transmission at least partially compensates for a previous low exposure of part of a die, and then controls an exposure of that part of the die.

11. The lithographic apparatus of claim 10, wherein the controller is further configured to rotate mirrors of the first array such that the sub-beams of radiation move from starting positions on the mirrors of the second array that provide maximum transmission of the sub-beams of radiation.

12. The lithographic apparatus of claim 10, wherein the controller is further configured to rotate mirrors of the first array such that the reduced transmission is provided with parts of the sub-beams of radiation falling outside of the mirrors of the second array.

13. The lithographic apparatus of claim 10, wherein the controller is further configured to rotate mirrors of the first array such that some sub-beams of radiation are moved in a first direction across the mirrors of the second array and other sub-beams of radiation are moved in a second direction across the mirrors of the second array, the second direction is opposite to the first direction.

14. The lithographic apparatus of claim 10, wherein the controller is further configured to rotate all of the mirrors of the first array.

15. The lithographic apparatus of claim 10, wherein the lithographic apparatus further comprises a memory that stores predetermined transmission calibration data as a function of rotation of the mirrors of the first array.

* * * * *